United States Patent [19]

Kanda et al.

[11] B 4,006,357

[45] Feb. 1, 1977

[54] APPARATUS FOR DISPLAYING IMAGE OF SPECIMEN

[75] Inventors: Kimio Kanda; Tadashi Ohtaka, both of Katsuta, Japan

[73] Assignee: Hitachi, Ltd., Japan

[22] Filed: July 5, 1974

[21] Appl. No.: 485,926

[44] Published under the second Trial Voluntary Protest Program on March 23, 1976 as document No. B 485,926.

[30] Foreign Application Priority Data

July 9, 1973    Japan ............................. 48-76632

[52] U.S. Cl. .......................... 250/310; 250/416 TV
[51] Int. Cl.² ....................................... H01J 37/26
[58] Field of Search .......... 250/310, 311, 306, 307, 250/309, 416

[56] References Cited

UNITED STATES PATENTS 3,812,288    5/1974    Walsh ............................... 250/311

*Primary Examiner*—Craig E. Church
*Attorney, Agent, or Firm*—Craig & Antonelli

[57] ABSTRACT

An apparatus is disclosed for facilitating adjustments of an image of a specimen obtained from an electron microscope and displayed on a cathode ray tube by displaying additionally and concurrently a wave form indicating information representative of contrast, focus, brightness or the like parameters of said image of the specimen. To this end, an electric specimen information signal is derived and applied alternatively to the Y-axis deflection coil and grid electrode of the display cathode ray tube (CRT) in response to a scanning line of the CRT in the direction of the X-axis thereof.

9 Claims, 7 Drawing Figures

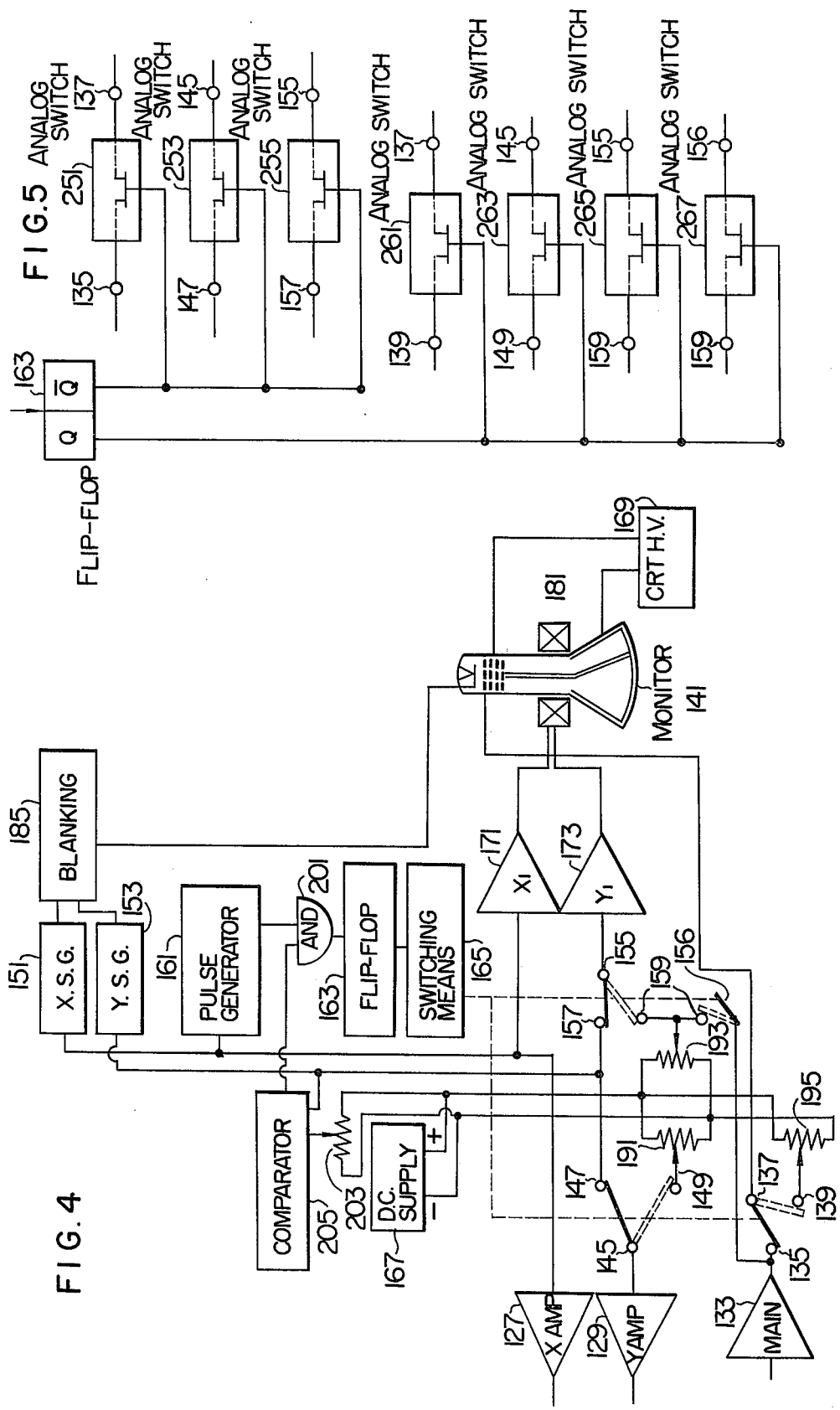

4,006,357

APPARATUS FOR DISPLAYING IMAGE OF SPECIMEN

BACKGROUND OF THE INVENTION

1. Field of the Invention

The present invention relates to an apparatus for displaying information signal of a specimen obtained by bombarding it with an accelerated electron beam in a form of an image representing various characteristics of the specimen on a cathode ray tube adapted to perform the scanning operation in synchronization with the bombarding electron beam.

2. Description of the Prior Art

It is known that, when a specimen is two-dimensionally scanned with an accelerated primary electron beam, secondary electrons, X-rays and cathode fluorescence are produced in dependence on the characteristics or inherent properties of the specimen. Further, the quantity of the primary electrons absorbed by the specimen as well as that of electrons passing through the specimen will vary depending on the individual specimens as employed. It is possible to visually observe various characteristics of the specimen by displaying the information of the secondary electrons, X-rays and cathode fluorescence as well as absorption or transmission of the primary electrons (which is hereinafter called specimen information) on a face plate of a cathode ray tube (hereinafter termed also simple CRT) in a form of visible image.

In order to produce a specimen image of a high quality, the primary electron beam must of course be properly focussed on the surface of the specimen. Besides, when information obtained from the specimen surface is amplified and then used to display an image of specimen on CRT, it is required to perform adjustments of contrast and brightness of the displayed image. Such adjustments have been heretofore made by observing the displayed image itself, and therefore a high skill is required to perform the adjustments for a relatively short time.

Accordingly, it will mean a great contribution in the art if an apparatus is available which allows a display of a wave form representing the information of focussing, contrast and birghtness of the image concurrently with the display of the image of specimen on one and the same cathode ray tube to thereby facilitate the adjustments of the above parameters for a short time with the aid of the displayed waveform.

In this case, it is very important to simultaneously display on the same CRT the wave form for adjustments and the image of specimen. In other words, the quality of the image as displayed may possibly be varied to a great extend even by a fine adjustment of the contrast, brightness or the like. It is thus required to carry out the fine adjustment by observing the specimen image and the wave form for adjustment at the same time.

SUMMARY OF THE INVENTION

An object of the invention is therefore to provide an apparatus which can display a wave form representing the prevailing states of focus, contrast and brightness simultaneously with the image of specimen on one and the same cathode ray tube.

According to the invention, a means is provided for performing a switching operation in response to the deflection in the X-axis direction of CRT so as to apply an electrical specimen signal derived from the specimen information onto the Y-axis deflecting means. As is know, the scanning of the face plate or screen of CRT is effected by two kinds of deflection means. Herein, the deflection means for a short period is defined as "X or X-axis deflection means", while the deflection means for a long period is defined as "Y or Y-axis deflection means".

In an embodiment of the invention, the image of the specimen and the wave form for adjustment may be alternatively produced by every other ones of the scanning lines. In another embodiment of the invention, arrangement may be made such that, when the deflection in the Y-axis direction has attained a preselected level or amount, the switching means may then be operated to apply the specimen information signal to the Y-axis deflection means to thereby display the wave form for adjustments.

The above and other objects as well as features and advantages of the invention will become more apparent by examining the following description of preferred embodiments of the invention. The description makes reference to the drawings.

BRIEF DESCRIPTION OF THE DRAWING

FIG. 4 is a block diagram showing a main portion of another embodiment of a display apparatus according to the invention.

FIG. 5 is a shematic circuit diagram of a switching means useful in the embodiments shown in FIGS. 1 and 4.

DETAILED DESCRIPTION OF THE PREFERRED EMBODIMENTS

Figure 1:
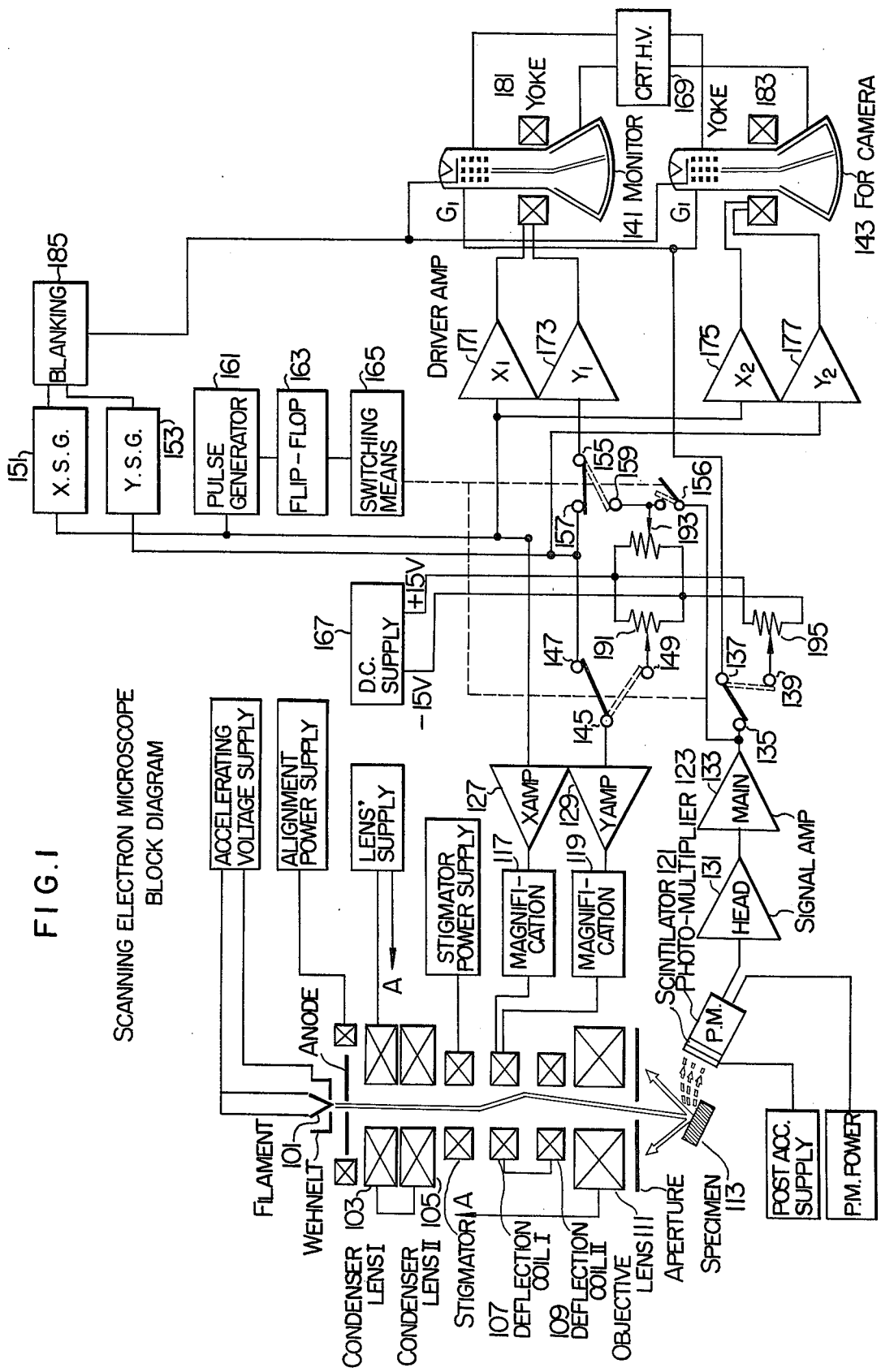
FIG. 1 is a block diagram of an embodiment of the invention applied to a scanning type of an electron microscope.

Now, the invention will be described with reference to an exemplary embodiment in which the invention is applied to an electron microscope of a scanning type. Referring to FIG. 1 which is a block diagram of the scanning electron microscope apparatus embodying the invention, electrons emitted from a filament 101 are bundled into an electron beam by means of condenser lenses 103 and 105 and then directed to deflection coils 107 and 109. The electron beam subsequently passes through an objective lens 111 and impinges upon a specimen 113. When the specimen 113 is bombarded by the primary electrons in this manner, reflected electrons, secondary electrons, X-rays and cathode fluorescence are produced from the surface of the specimen 113. In case the specimen is thin, some of the primary electrons will pass through it in accordance with characteristics of the specimen. There may exist some electrons which are absorbed by the specimen. In this way, various information can be obtained in correspondence with natures characteristic of the specimen which is bombarded with the primary electron beam. In this connection, it is possible to selectively take out desired ones of the information for observation by using an appropriate detector means which is capable of converting the resultant information into corresponding electrical signals. The electron microscope apparatus embodying the invention allows the visual observation of any one of the above information. When the secondary electrons are to be detected, for example, the detector means may be composed of a scintilator 121 and a photomultiplier 123. The scintilator 121 has a surface coated with an evaporated metal in a form of a thin layer and applied with voltage of ca. + 10kV. Secondary electrons emitted by the specimen are attracted toward the scintilator 121 under the influence of the above voltage and electrostatically accelerated to impinge on the scintilator 121, whereby the latter is excited to emit light which is then sensed by the photomultiplier 123 to be converted into a corresponding electric signal. The signal thus produced is supplied to a head or preamplifier 131 and a main amplifier 133. The specimen information signal thus amplified is then applied to a grid terminal of a cathode ray tube 143 provided for the recording by a photographic camera and a grid terminal of another cathode ray tube (CRT) 141 for monitoring through contacts 135 and 137 of a switching means 165. It will be noted that cathodes of these cathode ray tubes 141 and 143 are applied with respective blanking signals from a blanking signal generator 185. Further, output signals from and X-scanning signal generator 151 and a Y-scanning signal generator 153 are, respectively, fed to deflection coils 181 and 183 of CRT 141 and 143 by way of associated driver amplifiers 171, 173, 175, 177. Additionally, these scanning signals are supplied to deflection coils 107 and 109 of the electron microscope through an X-deflection amplifier 127 and a Y-deflection amplifier 129, respectively.

A pulse generator 161 responds to the output signal of the X-scanning signal generator 151 to produce a pulse for triggering a flip-flop 163. The switching means 165 as aforementioned will respond to the output signal from the flip-flop 163 to thereby change-over connections between contacts 145 and 147, 135 and 137 and 155 and 157 to connections between contacts 145 and 149, 155 and 159 and 137 and 139 or vice versa. Further, contacts 156 and 159 are closed or opened. It will be noted that the contacts 139, 149 and 159 are connected to variable resistors 195, 191 and 193, respectively, which resistors are applied with bias voltage from a direct current supply source 167.

Next, operations of the scanning type electron microscope apparatus shown in FIG. 1 will be described. It will be appreciated that one of the applications of the scanning electron microscope apparatus is to photographically record the image of specimen. To this end, adjustments of focus, brightness, contrast or the like parameters are performed with the aid of the monitor CRT 141, while the image of specimen is photographed by a photographic camera installed on the CRT 143.

The electron beam produced by the filament 101 is deflected in X- and Y-directions by means of the deflection coils 107 and 109 and projected to the specimen 113. The deflection coils 107 and 109 are supplied with saw-tooth current from the X-scanning signal generator 151 and the Y-scanning signal generator 153 through the X- and Y-amplifiers 127 and 129 as well as magnification circuits 117 and 119, whereby the specimen may be scanned with the electron beam both in the X- and Y-directions. The information such as that of secondary electrons obtained from the specimen due to the scanning by the electron beam is converted into electrical signal as hereinbefore described, which signal in turn is applied to the grid terminals of CRTs 141 and 143 for brightness modulation thereof. Since the deflection coils of CRTs 141 and 143 are applied with the signals from the X-scanning signal generator 151 and the Y-scanning signal generator 153 through the driver amplifiers 171, 173 and 175, 177, sweeps generated in CRTs 141 and 143 are always synchronized with that of the electron beam scanning the specimen 113. Accordingly, the image can be displayed on the front screens of the CRTs 141 and 143 simultaneously.

In response to the X-axis scanning signal, the pulse generator 161 and the flip-flop 163 are actuated to bring about the operation of the switching means 165. More specifically, for every scanning line, the contact 145 is changed-over to the contact 149 from the contact 147, the contact 145 is switched to the contact 159 from 157 and the contact 137 is to the contact 139 from the position 135, while the contacts 156 and 159 are closed and vice-versa. The mode of this operation will be described in more detail with reference to FIGS. 2A and 2B.

When a raster $a'_1$ has been swept on the front plate of CRT 141 in sychronization with a raster $a_1$ over the specimen 113, the various movable contacts 137, 145 and 155 are then changed-over to the positions indicated by dotted lines due to the operation of the switching means 165. Because the Y-axis amplifier 129 is applied with a voltage preset by the variable resistor 191, the electron beam will sweep the surface of specimen at the position corresponding to the voltage derived from the variable resistor 191. This position is represented by a raster line $a_2$ in FIG. 2A. The specimen information signal as produced during the sweep of the raster $a_2$ is, after having been amplified by the amplifiers 131 and 133, fed to the $Y_1$-driver amplifier 173 by way of the contacts 156, 159 and 155. In this manner, the position of the corresponding raster on the screen of the monitor CRT 141 in the direction of Y-axis is determined depending on the magnitude of the signal from the main amplifier 133. Since the output signal from the main amplifier 133 is to be applied to the grid of CRT 141 for the purpose of the brightness modulation of the displayed image of specimen 113, the position $\alpha$ of a raster $a'_2$ in the Y-axis direction shown in FIG. 2B will represent the brightness of the specimen image as displayed, while another displacement $\beta$ in the Y-axis direction indicates the contrast of the specimen image. When the leading edge of the displacement or increment $\beta$ rises sharply, this means that the electron beam is properly focused on the specimen 113. If the electron beam is out of focus, then the raising edge will become thicker and obscure.

Upon sweeping of a raster $a_3$, the flip-flop 163 is restored to the original state with the contacts of the switching means 165 returned to the starting positions, as a result of which a raster $a'_3$ for displaying the image of specimen is swept on the monitor CRT 141. Such process of operation will thereafter be repeated in similar manner.

Figure 3A:
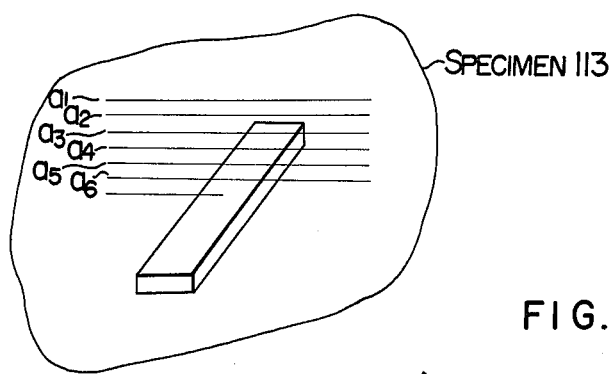
FIGS. 3A and 3B are similar views to FIGS. 2A and 2B and illustrate operation of a modified embodiment.
Figure 3B:
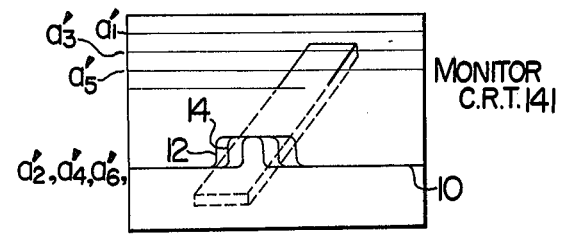

In the above description of the first embodiment, it has been assummed that the wave form for adjustment is displayed for every other raster scanning line with the input to the Y-axis amplifier 129 for deflecting the electron beam being each time biased to predetermined values under the control of the switching means 165. In other words, the wave form for aiding the adjustments is displayed in accordance with only the information signal relative to the specimen at a predetermined specific portion thereof. It should, however, be appreciated that the connection between the contacts 145 and 147 of the embodiment shown in FIG. 1 is not always necessarily changed-over. The Y-axis amplifier 129 may be applied at the input thereof continuously with saw-tooth wave voltage from the Y-axis scanning signal generator 153. FIGS. 3A and 3B illustrate the opertion for displaying the wave form for the adjustments in such case.

Referring to FIGS. 3A and 3B, the electron beam scanning the surface of the specimen is successively deflected so as to scan along the raster lines $a_1, a_2, a_3, a_4, a_5, a_6 - a_n$ as a function of time, as is shown in FIG. 3A. On the other hand, signal from the main amplifier 133 is applied, alternatively, to the grid of the monitoring CRT 141 and the driver amplifier 171 for the Y-axis deflection. Accordingly, the image on the display face of the monitor CRT 141 may be represented, for example, by the raster lines in odd numbers such as $a'_1, a'_3, a'_5$, while the raster lines in even numbers such as $a'_2, a'_4, a'_6$, compose the wave form 10 for adjustment, as can be seen from FIG. 3B. It will be noted in this case that the positions of the ramps or leading edges such as indicated by numerals 12 and 14 of the wave form 10 for the adjustments will be varied in dependence upon variations in the specific natures or characteristics of the specimen, since the scanning position of the electron beam is displaced over the surface of specimen 113. The ramps 12, 14, etc. then appear superposed on one another, which may give rise to some inconvenience for the observation by human eyes, as compared with the case of the first embodiment.

Figure 2A:
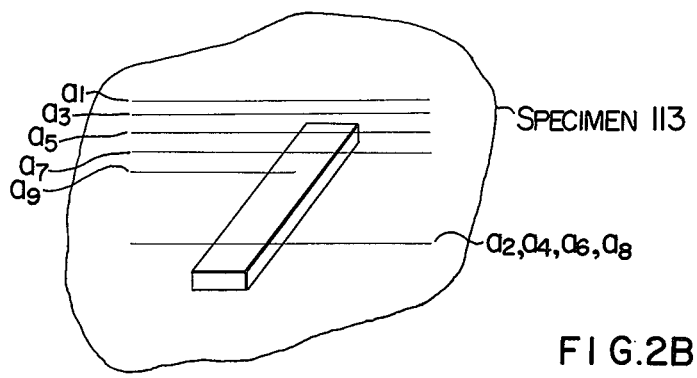
FIGS. 2A and 2B show scanning patterns of electron beams on a specimen and CRT to illustrate the operation of the apparatus shown in FIG. 1.
Figure 2B:
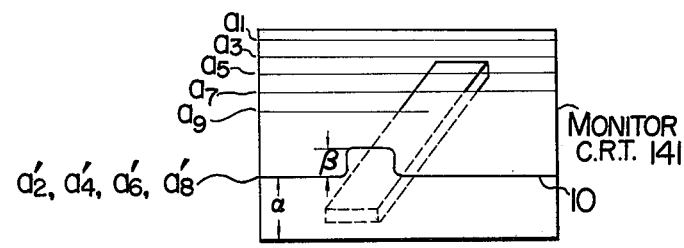

Turning again to the first embodiment illustrated in FIGS. 1, 2A and 2B, it will be understood that the positions of the scanning lines $a_2, a_4, a_6, a_8$, etc. on the surface of the specimen 113 for producing the image of wave form 10 for the adjustments in the monitor CRT may be displaced by regulating the variable resistor 191. Further, the brightness of the wave forms for the adjustments may be varied by means of the variable resistor 195. In this embodiment, the image of specimen 113 as well as the wave form for adjustment are displayed simultaneously over the screen of the monitor CRT 141. In case the contrast is to be adjusted, it is preferred to bring the wave forms $a'_2, a'_4, a'_6, a'_8$, etc. to the positions corresponding to those of the scanning lines $a_2, a_4, a_6, a_8$, etc. relative to the specimen. In this connection, it is possible to displace the display positions of the wave forms 10 for adjustments by means of the variable resistor 193.

FIG. 4 shows a modification of the embodiment shown in FIG. 1, wherein similar components are indicated by like reference symbols. The arrangement shown in FIG. 4 is different from that of FIG. 1 in that an AND gate 201, a variable resistor 203 and a comparator 205 are additionally provided.

It will be recalled that, in case of the embodiment shown in FIG. 1, the wave forms 10 for adjustments are produced in correspondence with every other scanning lines for the specimen. For example, the image of specimen is displayed by odd numbers of scanning lines, while the wave forms for adjustments are produced by even numbers of scanning lines. The image of specimen is therefore subjected to some deterioration in quality thereof. It will thus be advantageous to make provisions for displaying only the image of specimen until a predetermined position has been reached. To this end, the comparator 205 is applied with a predetermined voltage at an input thereof from the variable resistor 203, while the other input of the comparator 205 receives the output from the Y-scanning signal generator 153. So long as the output from the Y-scanning signal generator remains at a lower level than the voltage level set by the variable resistor 203, the comparator 205 will produce no output, as a result of which the AND gate 201 also remains in the non-conductive state. Accordingly, the switching means 165 is not actuated.

As the scanning line is displaced in the direction of Y-axis, the output from the Y-scanning signal generator 153 is progressively increased. At the time when the output from the generator 153 becomes greater than the preset voltage from the variable resistor 203, the comparator 205 will produce an output signal which in turn opens the AND gate 201, whereby the pulse signal from the pulse generator 161 is applied to the flip-flop 163. The switching means 165 then responds to the output from the flip-flop 163 and the wave form 10 for adjustments now can be displayed in the manner or described with reference to FIG. 1. As an alternative method to accomplish substantially the same effect, a counter (not shown) may be employed for counting the number of the scanning lines. When the contents of the counter reaches a predetermined value, the AND gate 201 is thereby opened to operate the switching means 165 through the flip-flop 163.

Although the switching means 165 as well as the associated contacts may be composed of an electromagnetic relay device, it is preferable to use analogue switches such as field effect transistors (FET). FIG. 5 shows exemplarily an arrangement of the switching means constituted by the field effect transistors. While no input is applied to the flip-flop 163, the reset output Q thereof will make conducting paths between the contacts 135 and 137, 147 and 145, and 157 and 155. An input to the flip-flop 163 will then form conducting paths between the contacts 139 and 137, 149 and 145, and 159 and 155, with the contact 156 connected to the contact 159 at the same time. Another input to the flip-flop 163 of course will reset the flip-flop to the starting state producing Q output.

As above described, analogue switches 251, 253, 255, 261, 263, 265 and 267 may be composed of FET. These switches are commercially available as integrated circuits incorporating therein respective FETs and amplifiers in combination.

As is apparent from the foregoing description, according to the invention, the image of specimen is displayed on the monitor CRT together with wave forms for aiding adjustments in photographing the image on the CRT for camera, which facilitate and simplify any desired adjustments. After the adjustment has been made, the switching means may be made in operative to thereby display only the image of specimen.

While the invention has been described with reference to preferred embodiments, it should be appreciated to those skilled in the art that they are merely examples to illustrate the principle of the invention and many modifications as well as choices in design may be made without departing from the spirit and scope of the invention.

We claim:
1. Apparatus for displaying an image of a speciment, comprising:
   a. means for producing and accelerating an electron beam to be projected on said specimen, b. first means for deflecting said accelerated electron beam in directions of X- and Y-axes to thereby scan a surface of said specimen,
c. means for converting information representative of states or properties of said specimen resulting from said electron beam bombardment of said specimen into corresponding electrical specimen information signals,
d. at least one cathode ray tube,
e. second means coupled with said cathode ray tube for deflecting an electron beam thereof in directions of X- and Y-axes,
f. brightness modulating means for producing an image of said specimen on a viewing face of said cathode ray tube in accordance with said electrical specimen information signals,
g. third means for producing an output in response to at least said X-axis second deflection means, and
h. fourth means responsive to said output from said third means for applying said electrical specimen information signals to said Y-axis second deflection means to thereby additionally produce on said viewing face of said cathode ray tube a wave form for aiding desired adjustments in the display of said image of said specimen.

2. Apparatus as set forth in claim 1, wherein said fourth means comprises a first variable resistor for applying a variable biasing direct current voltage to a grid electrode of said cathode ray tube so that brightness of said wave form for adjustment may be controlled by said biasing voltage upon operation of said fourth means.

3. Apparatus as set forth in claim 2, wherein said fourth means further comprises a second variable resistor for applying a variable biasing direct current voltage to said Y-axis second deflection means when said fourth means is operated.

4. Apparatus as set forth in claim 3, wherein said fourth means further comprises a third variable resistor for applying a variable biasing direct current voltage to said Y-axis first deflection means upon operation of said fourth means.

5. Apparatus as set forth in claim 1, wherein said third means is arranged for producing an output signal in response to operations of said X- and Y-axes second deflection means.

6. Apparatus as set forth in claim 5, wherein said single detector includes a scintillator and photomultiplier.

7. Apparatus as set forth in claim 1, wherein said converting means includes a single detector for providing the electrical specimen information signals.

8. Apparatus as set forth in claim 1, wherein said third means includes a pulse generator responsive to the output of said X-axis second deflection means and a flip-flop for providing an output in accordance with at least the output of said pulse generator means.

9. Apparatus as set forth in claim 8, wherein said fourth means includes switching means responsive to the output of said flip-flop for applying said electric specimen information signal to said Y-axis second deflection means.

* * * * *